(12) United States Patent
Lee et al.

(10) Patent No.: US 8,854,137 B2
(45) Date of Patent: Oct. 7, 2014

(54) APPARATUS AND CIRCUIT FOR AMPLIFYING BASEBAND SIGNAL

(71) Applicant: Samsung Electronics Co. Ltd., Suwon-si (KR)

(72) Inventors: Jong-Woo Lee, Seongnam-si (KR); Si-Bum Jun, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/715,537

(22) Filed: Dec. 14, 2012

(65) Prior Publication Data

US 2013/0154741 A1 Jun. 20, 2013

(30) Foreign Application Priority Data

Dec. 16, 2011 (KR) .......................... 10-2011-0136718

(51) Int. Cl.
*H03F 3/45* (2006.01)
*H03L 7/00* (2006.01)

(52) U.S. Cl.
CPC ........ *H03F 3/45071* (2013.01); *H03F 3/45977* (2013.01); *H03L 7/00* (2013.01); *H03F 2203/45514* (2013.01); *H03F 2203/45138* (2013.01); *H03F 3/45475* (2013.01)
USPC .......................................... 330/260; 330/258

(58) Field of Classification Search
CPC ............ H03F 3/45183; H03F 3/45659; H03F 3/45479; H03F 2203/45424; H03F 3/45475; H03F 1/3211; H03F 3/45071; H03F 1/34; H03F 1/083
USPC ................................................. 330/252–261
See application file for complete search history.

(56) References Cited

U.S. PATENT DOCUMENTS

| 6,285,311 | B1 | 9/2001 | Lewicki | |
|---|---|---|---|---|
| 6,351,506 | B1 | 2/2002 | Lewicki | |
| 7,777,663 | B2* | 8/2010 | Akizuki et al. | 341/172 |
| 8,283,981 | B2* | 10/2012 | Wakamatsu | 330/258 |
| 2002/0024382 | A1 | 2/2002 | Kwan et al. | |
| 2003/0001674 | A1 | 1/2003 | Nagaraj | |
| 2004/0021511 | A1 | 2/2004 | Michalski | |
| 2010/0112971 | A1* | 5/2010 | Matsuno et al. | 455/313 |

FOREIGN PATENT DOCUMENTS

EP              1 168 603 A1    1/2002

* cited by examiner

*Primary Examiner* — Hieu Nguyen
(74) *Attorney, Agent, or Firm* — Jefferson IP Law, LLP

(57) ABSTRACT

An operational amplifier circuit is provided. The operational amplifier circuit includes a differential amplifier of a cascade structure and a switched-capacitor type Common-Mode FeedBack (CMFB) circuit. The differential amplifier amplifies a difference between two input signals to output an anode output voltage and a negative output voltage. The switched-capacitor type CMFB circuit averages the anode output voltage and the negative output voltage of the differential amplifier, compares the average voltage with a reference voltage to generate a feedback signal based on a result of the comparison, and provides the feedback signal to the differential amplifier. Therefore, power consumption is reduced and a battery use time of a wireless terminal can be extended. Also, since an operational amplifier gain of each analog filter terminal is not negatively affected, a Direct Current (DC) offset is reduced, thereby improving signal quality.

19 Claims, 5 Drawing Sheets

APPARATUS AND CIRCUIT FOR AMPLIFYING BASEBAND SIGNAL

PRIORITY

This application claims the benefit under 35 U.S.C. §119 (a) of a Korean patent application filed on Dec. 16, 2011 in the Korean Intellectual Property Office and assigned Serial No. 10-2011-0136718, the entire disclosure of which is hereby incorporated by reference.

BACKGROUND OF THE INVENTION

1. Field of the Invention

The present invention relates to a circuit for amplifying a baseband analog signal in a receiver. More particularly, the present invention relates to a differential operational amplifier to which a switched-capacitor type Common-Mode FeedBack (CMFB) circuit is coupled.

2. Description of the Related Art

Generally, a baseband analog filter forming a Radio Frequency Integrated Circuit (RFIC) of a receiver includes a differential Operational Amplifier (OpAmp) of a serial structure of a fifth degree or more. For example, the baseband analog filter has a structure where five or more differential operational amplifiers are serially connected. In each stage, one or more differential amplifiers are used. Each operational amplifier uses a Miller scheme of a second degree cascade structure or a telescopic structure of a cascade scheme. Also, a Common-Mode FeedBack (CMFB) circuit for calculating an average of two signals of an output terminal and feeding back the same is used to maintain a constant common-mode of a differential amplifier.

A CMFB circuit used by a feedforward second degree cascade OpAmp of the related art employs a current mirror method, and detects an average of voltages between outputs at both terminals using a resistor, and copies the same to a current mirror to control a bias current, thereby maintaining dynamic equilibrium of a common mode.

However, the circuit detecting an average of voltages between outputs at both terminals using a resistor lowers output impedance due to the resistance, so that a gain of an OpAmp is deteriorated.

Also, since the CMFB should have a gain-bandwidth product that is the same as the OpAmp in order to maintain stability, power consumption is considerable and occupies about 40% of the power consumed by each OpAmp Since a baseband filter makes up a large portion of an RFIC in a wireless terminal, power consumption increases due to the CMFB of the OpAmp Accordingly, battery use time reduces, which lowers competitiveness of a product employing the CMFB.

Therefore, a need exists for a CMFB for reducing power consumption generated by the CMFB of an OpAmp.

The above information is presented as background information only to assist with an understanding of the present disclosure. No determination has been made, and no assertion is made, as to whether any of the above might be applicable as prior art with regard to the present invention.

SUMMARY OF THE INVENTION

Aspects of the present invention are to address at least the above-mentioned problems and/or disadvantages and to provide at least the advantages described below. Accordingly, an aspect of the present invention is to provide a differential operational amplifier to which a switched-capacitor type Common-Mode FeedBack (CMFB) circuit having low power consumption couples.

Another aspect of the present invention is to provide an apparatus for reducing power consumption generated by a baseband analog signal amplifier of a reception terminal.

Still another aspect of the present invention is to provide an apparatus for providing a clock for driving a switched capacitor type CMFB circuit.

Yet another aspect of the present invention is to provide an apparatus for synchronizing a driving clock of a switched capacitor type CMFB circuit with a sampling clock of an Analog-to-Digital Converter (ADC) to remove a harmonic component.

In accordance with an aspect of the present invention, an operational amplifier circuit is provided. The operational amplifier circuit includes a differential amplifier of a cascaded structure, for amplifying and outputting a difference between two signals, and a switched-capacitor type CMFB circuit for averaging an anode output voltage and a cathode output voltage of the differential amplifier, for comparing the average voltage with a reference voltage to generate a feedback signal based on a result of the comparison, and for providing the feedback signal to the differential amplifier, wherein the operational amplify circuit further includes a clock generator for synchronizing a clock for driving the switched-capacitor type CMFB circuit with a sampling clock of an ADC, and a common voltage of the differential amplifier is controlled depending on the feedback signal of the CMFB circuit and maintained constant.

In accordance with another aspect of the present invention, a receiver is provided. The receiver includes an analog baseband unit for amplifying a baseband signal, an ADC for converting a signal from the analog baseband unit into a digital signal, and a clock generator for synchronizing a clock driving the analog baseband unit with a sampling clock of the ADC.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings in which.

Throughout the drawings, like reference numerals will be understood to refer to like parts, components and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions are omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Exemplary embodiments of the present invention provide an apparatus and a circuit for amplifying a baseband signal. Particularly, exemplary embodiments of the present invention provide a differential operational amplifier to which a switched-capacitor type Common-Mode FeedBack (CMFB) circuit is coupled.

Figure 1:
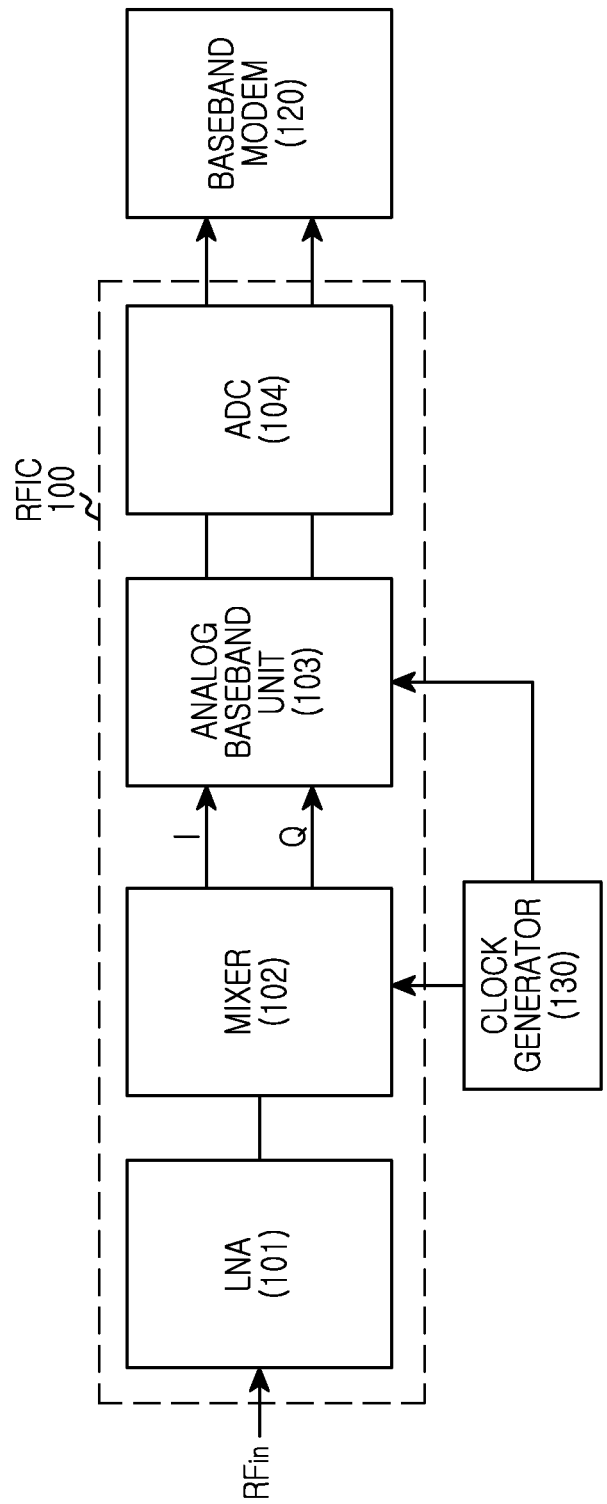
FIG. 1 is a block diagram illustrating a receiver according to an exemplary embodiment of the present invention.

FIG. 1 is a block diagram illustrating a receiver according to an exemplary embodiment of the present invention.

Referring to FIG. 1, the receiver includes a Radio Frequency Integrated Circuit (RFIC) 100, a baseband modem 120, and a clock generator 130. The RFIC 100 includes a Low Noise Amplifier (LNA) 101, a mixer 102, an analog baseband unit 103, and an Analog-to-Digital Converter (ADC) 104.

The RFIC 100 converts a Radio Frequency (RF) signal into a baseband signal. For this purpose, the LNA 101 amplifies a signal while maximally suppressing a noise included in the received RF signal, and outputs the same to the mixer 102. The mixer 102 synthesizes a Local Oscillator (LO) frequency from the clock generator 130 and a low-noise amplified RF signal from the LNA 101 to down-convert the RF signal to an Intermediate Frequency (IF) band or a baseband and outputs the same. Depending on the implementation, an RF signal may be down-converted to the IF band and then the IF band may be down-converted to the baseband. Depending on different implementations, the RF signal may be directly down-converted to the baseband. The analog baseband unit 103 band-pass-filters only a desired signal among the down-converted RF signals using a clock divided by 1/n from a local oscillator frequency of the clock generator 130, and amplifies the same. The ADC 104 converts a down-converted signal from the analog baseband unit 103 to a digital signal using a clock divided by 1/n from a local oscillator frequency of the clock generator 130, and outputs the same. Also, a blocker component of a baseband signal is removed via each analog filter terminal of the analog baseband unit 103, and the baseband signal is controlled to an input dynamic range of the ADC 104, converted into a digital signal, and transferred to the baseband modem 120. An example of the analog baseband unit 103 is described below with reference to FIG. 2.

The baseband modem 120 demodulates the digital signal as an information signal according to a communication scheme. For example, the baseband modem 120 may demodulate the digital signal based on a communication scheme such as Code Division Multiple Access (CDMA), Wideband Code Division Multiple Access (WCDMA), High-Speed Downlink Packet Access (HSDPA), and Long Term Evolution (LTE).

The clock generator 130 generates a local oscillator frequency to provide the same to the mixer 102 of the RFIC 100. Also, the clock generator 130 divides a local oscillator frequency from the clock generator 130 by ½ or ¼ to provide the same to the analog baseband unit 103 or the ADC 104.

Figure 2:
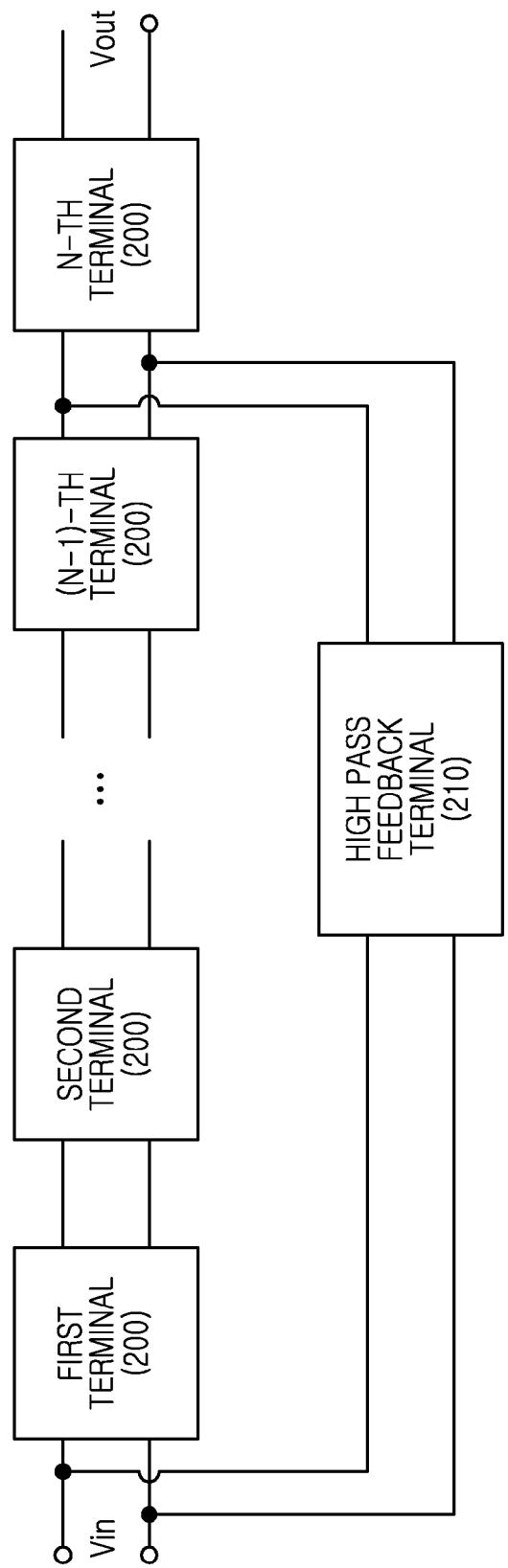
FIG. 2 is a block diagram illustrating an analog baseband unit according to an exemplary embodiment of the present invention.

FIG. 2 is a block diagram illustrating an analog baseband unit according to an exemplary embodiment of the present invention.

Referring to FIG. 2, a plurality of analog filter terminals 200 of one degree or more couple to form an analog baseband unit, such as analog baseband unit 103 of FIG. 1. In addition, a high pass feedback terminal 210 is connected between a first amplify terminal 200 and an n-th amplify terminal 200, and removes a noise included in a Direct Current (DC) component and also removes a DC offset.

Here, each analog filter terminal 200 includes a differential operational amplifier, a variable resistor, a variable capacitor, etc. The gain and the cut-off frequency of the analog filter terminal 200 are controlled by the variable resistor and the variable capacitor. That is, the gain of each analog filter terminal 200 is determined by a ratio of an input resistor to a feedback resistor, and the cut-off frequency is inversely proportional to a product of a feedback resistor and a feedback capacitor. Also, a feedback coefficient is determined by combination of a resistor and a capacitor at each analog filter terminal 200, so that the analog filter terminal 200 operates as a low-pass filter.

Meanwhile, the differential operational amplifier reacts to only a differential signal to have a gain, and it is preferable that a gain for a common-mode is close to zero. However, in an actual implementation, a center point of an output signal varies by movement of the common-mode. In other words, a case where a bias voltage of an inner node becomes unstable is a state where an operation point and an average voltage of the anode output signal and the cathode output signal deviates from a reference voltage.

Therefore, to correct this, a CMFB circuit for detecting an average of both output signal terminals and for controlling a bias current of a transistor using the detected average to maintain a constant common-mode is needed. That is, the CMFB circuit provides a feedback signal, used to allow an average voltage of the anode output signal and the cathode output signal of the differential operational amplifier to coincide with the reference voltage, to the differential operational amplifier.

Figure 3:
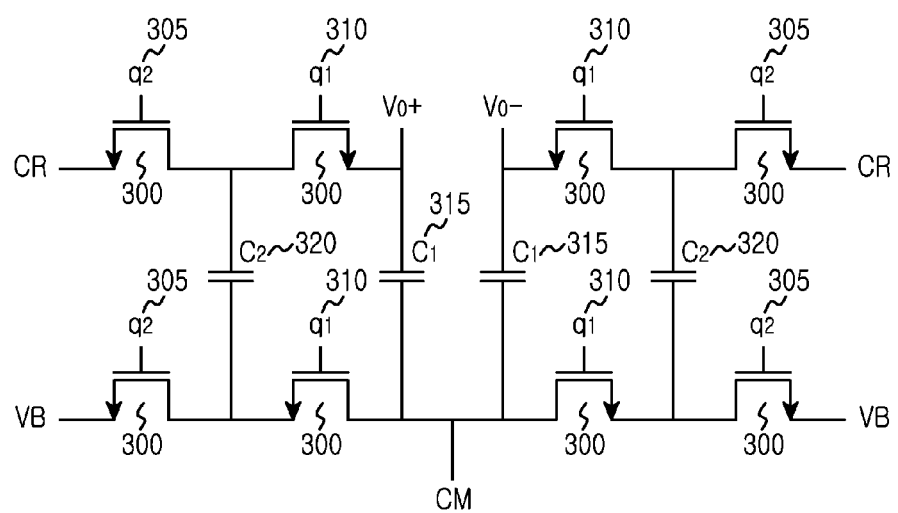
FIG. 3 is a view illustrating a Common-Mode FeedBack (CMFB) circuit according to an exemplary embodiment of the present invention.

The CMFB circuit of the differential operational amplifier used for each analog filter terminal uses the switched capacitor, such as the switched capacitor illustrated in FIG. 3, and a driving clock of the CMFB circuit is synchronized with an ADC sampling clock.

FIG. 3 illustrates a CMFB circuit according to an exemplary embodiment of the present invention.

Referring to FIG. 3, the CMFB circuit includes a plurality of transistors 300, a first capacitor 315, and a second capacitor 320. The transistor may be a Metal-Oxide Semiconductor (MOS) Field-Effect Transistor (FET) or a Complementary Metal-Oxide Semiconductor (CMOS) FET.

Figure 5:
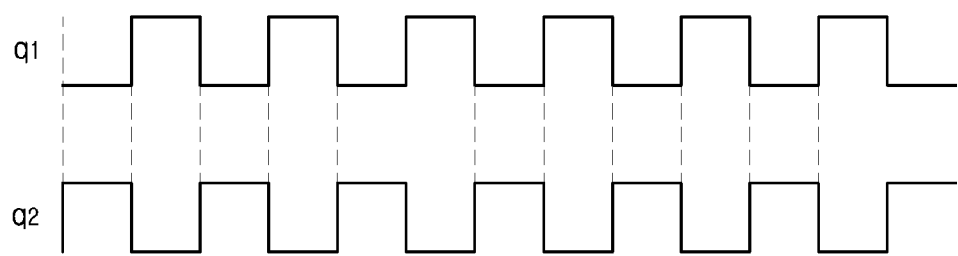
FIG. 5 is a view illustrating clocks of q1 and q2 provided to a CMFB circuit according to an exemplary embodiment of the present invention.

The CMFB circuit is divided into four segments where a drain of a first transistor and a source of a second transistor are connected. Two segments are connected to two capacitors C1 and C2, and the other two segments are connected to the other two capacitors C1 and C2. Two segments connected by two capacitors C1 and C2 are serially connected. Here, a clock q1 310 or a clock q2 305 is supplied via a gate G of each transistor. In the CMFB circuit, a non-overlapping clock is supplied as the clock q1 310 and the clock q2 305 as illustrated in FIG. 5. That is, when a clock is supplied to q1, a clock is not supplied to q2. And, when a clock is supplied to q2, a clock is not supplied to q1.

An operation of the CMFB circuit is described. When positive output voltage (V0+) and negative output voltage (V0−), which are both output voltages of the differential operational amplifier, are input to the CMFB circuit, a clock is provided to the clock q1 310, so that the capacitor C1 315 is charged with an output voltage of the differential operational amplifier. When a clock is provided to the next q2 305 and a clock is not provided to q1 310, both ends of the capacitor C2 320 are charged with a voltage corresponding to a difference between an ideal output common voltage CR and an ideal input bias voltage VB. This process is repeated at the clock q1 310 and the clock q2 305 in turns, so that a feedback output voltage CM is formed.

Figure 4:
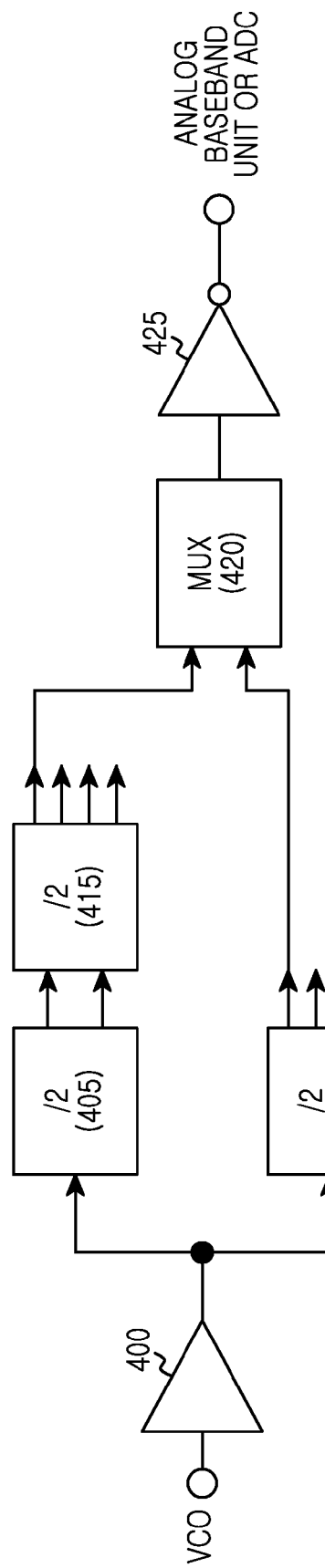
FIG. 4 is a view illustrating an example of dividing a clock in a clock generator according to an exemplary embodiment of the present invention.

FIG. 4 illustrates an example of dividing a clock in a clock generator according to an exemplary embodiment of the present invention.

Referring to FIG. 4, an LO frequency from a clock generator, such as the clock generator 130, is provided to ½ dividers 405 and 410 via an inverter 400. Here, the inverter 400 may be omitted. Each of the ½ dividers 405 and 410 divides a clock corresponding to the LO frequency from the clock generator (e.g., clock generator 130) by ½. The ½ divider 405 outputs a ½-divided clock to a ½ divider 415, and the ½ divider 410 outputs a ½-divided clock to a MUX 420. The ½ divider 415 divides the ½-divided clock from the ½ divider 405 by ½ and outputs the same to the MUX 420.

The MUX 420 outputs a ½-divided clock or a ¼-divided clock depending on a control signal. The output of the MUX 420 may be provided to an inverter 425. The output of the inverter 425 may be provided to, for example, the analog baseband unit 103 and the ADC 104. Here, the inverter 425 may be omitted.

Therefore, a sampling clock of the ADC 104 is generated by dividing a clock from the clock generator 130 and fundamentally cuts off a spurious component by mixing with a clock from the clock generator 130.

FIG. 5 is a view illustrating clocks of q1 and q2 provided to a CMFB circuit according to an exemplary embodiment of the present invention.

Referring to FIG. 5, clocks of q1 and q2 provided to the CMFB circuit do not overlap with each other, and also the clocks of q1 and q2 are synchronized with a sampling clock of the ADC 104 generated by dividing a clock from the clock generator 130.

As described above, a switched capacitor type CMFB circuit is used, so that power consumption is reduced and a battery use time of a wireless terminal can be extended. Also, since an Operational Amplifier (OpAmp) gain of each analog filter terminal is not negatively affected, a DC offset is reduced, thereby improving signal quality.

Also, since a clock synchronized with an ADC is used, a separate clock source is not required. Thus a process area is minimized and a manufacturing cost is reduced. Also, since the circuit is not influenced by a harmonic component via a synchronized signal, quality deterioration of a signal is prevented.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. An operational amplifier circuit, the operational amplifier circuit comprising:
a differential amplifier of a cascade structure, for amplifying a difference between two input signals to output an anode output voltage and a cathode output voltage; and
a switched-capacitor type Common-Mode FeedBack (CMFB) circuit for averaging the anode output voltage and the cathode output voltage of the differential amplifier, for comparing the average voltage with a reference voltage to generate a feedback signal based on a result of the comparison, and for providing the feedback signal to the differential amplifier,
wherein the switched-capacitor CMFB circuit charges, in a first time period, a second capacitor, connected between an ideal common output voltage and an ideal input bias voltage, and a first capacitor, connected between an output voltage of the differential operational amplifier and a feedback output voltage, and discharges the second capacitor to the first capacitor in a second time period.

2. The operational amplifier circuit of claim 1, wherein the CMFB circuit comprises:
a first transistor and a second transistor for switching depending on a first clock;
the first capacitor for being charged with a positive output voltage of the differential operational amplifier depending on the first clock;
a third transistor and a fourth transistor for switching depending on a second clock; and
the second capacitor for being charged with the voltage corresponding to a difference between the ideal output common voltage and the ideal input bias voltage while the voltage charging the first capacitor is discharged depending on the second clock.

3. The operational amplifier circuit of claim 2, wherein, when the first clock is turned on, the second clock is turned off, and when the first clock is turned off, the second clock is turned on.

4. The operational amplifier circuit of claim 2, wherein a drain of the first transistor and a drain of the third transistor are connected,
wherein a source of the second transistor and a drain of the fourth transistor are connected,
wherein the first capacitor is connected between the source of the first transistor and the drain of the second transistor, and
wherein the second capacitor is connected between the drain of the third transistor and the drain of the fourth transistor.

5. The operational amplifier circuit of claim 2, wherein the first clock is supplied to gates of the second transistor and the first transistor, and the second clock is supplied to gates of the fourth transistor and the third transistor.

6. The operational amplifier circuit of claim 1, wherein the CMFB circuit comprises:
a first transistor and a second transistor for switching depending on a first clock;
the first capacitor for being charged with a negative output voltage of the differential operational amplifier depending on the first clock;

a third transistor and a fourth transistor for switching depending on a second clock; and the second capacitor for being charged with the voltage corresponding to the difference between the ideal output common voltage and the ideal input bias voltage while the voltage charging the first capacitor is discharged depending on the second clock.

7. The operational amplifier circuit of claim 6, wherein, when the first clock is turned on, the second clock is turned off, and when the first clock is turned off, the second clock is turned on.

8. The operational amplifier circuit of claim 6, wherein a drain of the first transistor and a drain of the third transistor are connected, wherein a source of the second transistor and a drain of the fourth transistor are connected, wherein the first capacitor is connected between the source of the first transistor and the drain of the second transistor, and wherein the second capacitor is connected between the drain of the third transistor and the drain of the fourth transistor.

9. The operational amplifier circuit of claim 6, wherein the first clock is supplied to gates of the first transistor and the second transistor, and the second clock is supplied to gates of the third transistor and the fourth transistor.

10. The operational amplifier circuit of claim 1, further comprising:

a clock generator for synchronizing a clock for driving the switched capacitor type CMFB circuit with a sampling clock of an Analog-to-Digital Converter (ADC).

11. The operational amplifier circuit of claim 10, wherein the sampling clock of the ADC is generated by dividing a local oscillator clock by an integer.

12. The operational amplifier circuit of claim 1, wherein a common voltage of the differential amplifier is controlled and maintained constant depending on the feedback signal of the CMFB circuit.

13. A receiver comprising:

an analog baseband unit for amplifying a baseband signal;

an Analog-to-Digital Converter (ADC) for converting a signal from the analog baseband unit into a digital signal; and a clock generator for providing a synchronized clock for driving the analog baseband unit and the ADC, wherein the analog baseband unit comprises a plurality of analog filter terminals coupled with each other, wherein each analog filter terminal comprises an operational amplifier, a variable resistor, and a variable capacitor, wherein the operational amplifier comprises:

a differential amplifier of a cascade structure, for amplifying and outputting a difference between two signals; and a switched-capacitor type Common-Mode FeedBack (CMFB) circuit for averaging an anode output voltage and a cathode output voltage of the differential amplifier, for comparing the average voltage with a reference voltage to generate a feedback signal based on a result of the comparison, and for providing a feedback signal to the differential amplifier, and wherein the switched-capacitor CMFB circuit charges, in a first time period, a second capacitor, connected between an ideal common output voltage and an ideal input bias voltage, and a first capacitor, connected between an output voltage of the differential operational amplifier and a feedback output voltage, and discharges the second capacitor to the first capacitor in a second time period.

14. The receiver of claim 13, wherein the CMFB circuit comprises:

a first transistor and a second transistor for switching depending on a first clock;

the first capacitor for being charged with one of a positive and a negative output voltage of the differential operational amplifier depending on the first clock;

a third transistor and a fourth transistor for switching depending on a second clock; and the second capacitor for being charged with the voltage corresponding to the difference between the ideal output common voltage and the ideal input bias voltage while the voltage charging the first capacitor is discharged depending on the second clock.

15. The receiver of claim 14, wherein when the first clock is turned on, the second clock is turned off, and when the first clock is turned off, the second clock is turned on.

16. The receiver of claim 14, wherein a drain of the first transistor and a drain of the third transistor are connected, wherein a source of the second transistor and a drain of the fourth transistor are connected, wherein the first capacitor is connected between the source of the first transistor and the drain of the second transistor, and wherein the second capacitor is connected between the drain of the third transistor and the drain of the fourth transistor.

17. The receiver of claim 16, wherein the first clock is supplied to gates of the second transistor and the first transistor, and the second clock is supplied to gates of the fourth transistor and the third transistor.

18. The receiver of claim 13, further comprising:

a baseband modem for demodulating a digital signal from the ADC as an information signal according to a communication scheme.

19. The receiver of claim 13, wherein the sampling clock of the ADC is generated by dividing a local oscillator clock by an integer.

* * * * *